United States Patent
Morisada (10) Patent No.: US 7,342,645 B2
(45) Date of Patent: Mar. 11, 2008

(54) STAGE CONTROL APPARATUS AND METHOD, STAGE APPARATUS AND EXPOSURE APPARATUS

(75) Inventor: Masahiro Morisada, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 198 days.

(21) Appl. No.: 11/338,773

(22) Filed: Jan. 25, 2006

(65) Prior Publication Data
US 2006/0176464 A1 Aug. 10, 2006

(30) Foreign Application Priority Data
Feb. 10, 2005 (JP) ............... 2005-035210

(51) Int. Cl.
*G03B 27/58* (2006.01)
*G03B 27/42* (2006.01)
*G03B 27/52* (2006.01)

(52) U.S. Cl. .................. 355/72; 355/53; 355/55
(58) Field of Classification Search ............ 355/72, 355/53, 55, 75; 356/399, 400, 401; 359/577
See application file for complete search history.

(56) References Cited

U.S. PATENT DOCUMENTS

| | | | |
|---|---|---|---|
| 5,936,710 A | 8/1999 | Itoh et al. ............. | 355/53 |
| 6,160,612 A | 12/2000 | Itoh et al. ............. | 355/53 |
| 6,400,456 B1* | 6/2002 | Miyachi ............... | 356/399 |
| 6,750,950 B1* | 6/2004 | Miyachi ............... | 355/55 |
| 6,879,382 B2 | 4/2005 | Akutsu et al. ......... | 355/67 |
| 6,882,405 B2* | 4/2005 | Jasper et al. .......... | 355/55 |
| 6,882,477 B1* | 4/2005 | Schattenburg et al. .. | 359/577 |
| 6,903,806 B2 | 6/2005 | Morisada ............. | 355/72 |
| 6,975,383 B2 | 12/2005 | Morisada ............. | 355/53 |
| 7,119,879 B2 | 10/2006 | Morisada ............. | 355/53 |
| 2005/0179880 A1* | 8/2005 | Butler et al. .......... | 355/53 |
| 2006/0176464 A1 | 8/2006 | Morisada ............. | 355/72 |

FOREIGN PATENT DOCUMENTS

JP       2002-280283       9/2002

\* cited by examiner

*Primary Examiner*—Peter B. Kim
(74) *Attorney, Agent, or Firm*—Fitzpatrick, Cella, Harper & Scinto (57) ABSTRACT

A stage control apparatus for controlling a stage on which a substrate can be placed and moved generates a target value relating to a vertical direction of the stage based upon substrate surface position information that corresponds to unevenness of the surface of the substrate and generates a drive command signal of the stage based upon a deviation signal between the target value generated and a measured position of the stage. A target frequency is decided upon a spatial frequency possessed by the unevenness of the substrate surface. In order to generate the drive command signal, use is made of a signal obtained by amplifying a component of the target frequency of the deviation signal.

18 Claims, 7 Drawing Sheets

STAGE CONTROL APPARATUS AND METHOD, STAGE APPARATUS AND EXPOSURE APPARATUS

FIELD OF THE INVENTION

This invention relates to a stage control apparatus used in a semiconductor exposure apparatus, or the like.

BACKGROUND OF THE INVENTION

Figure 7:
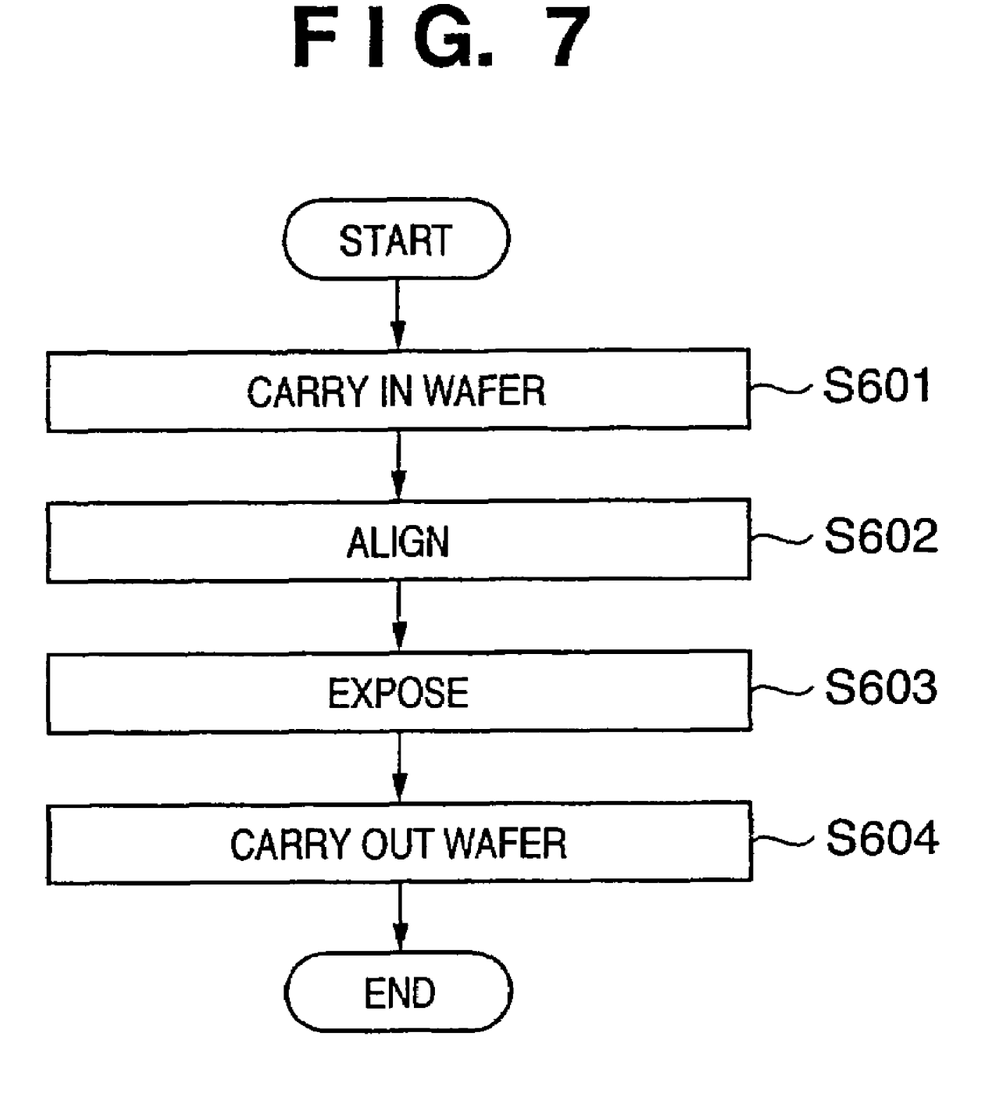
FIG. 7 is a flowchart illustrating a sequence for aligning a wafer and for exposure in an ordinary semiconductor exposure apparatus.

FIG. 7 is a flowchart illustrating a sequence for aligning a wafer and for exposure in a semiconductor exposure apparatus using an ordinary stage control apparatus. Ordinary stage control in the exposure operation of the semiconductor exposure apparatus will be described using the flowchart of FIG. 7.

First, a wafer is carried into the semiconductor exposure apparatus (step S601). When the wafer is supplied to and placed on an XY stage, the wafer is aligned (alignment processing is executed) with respect to a mask before exposure is carried out (step S602). In this alignment processing, first, approximate alignment of the wafer is performed initially and then the coordinate position of each shot on the wafer is measured.

Next, the mask and wafer are aligned based upon the coordinate position of each shot obtained by the alignment processing and the mask pattern is exposed on the wafer (step S603). At the time of such exposure, displacement of the wafer in the vertical direction is detected in real time and focus control is performed in such a manner that the mask pattern will be transferred to the wafer appropriately. When exposure of the wafer ends, the wafer is transported from the XY stage (step S604). Thus, the sequence of FIG. 7 is repeated by a single wafer stage in an ordinary semiconductor exposure apparatus.

There is also a semiconductor exposure apparatus equipped with a structure, which is referred to as "twin stages", having two movable stage on which wafers are placed and moved (see the specification of Japanese Patent Application Laid-Open No. 2002-280283). By employing twin stages, throughput can be improved by executing parts of the above-described sequence in parallel. For example, if exposure processing is executed by performing alignment processing and focus measurement using one stage (referred to as a "measurement stage" below) and performing exposure processing using the other stage (referred to as an "exposure stage" below), overall wafer treatment efficiency of the apparatus can be improved. The reason for this is that in the case of twin stages, although the time required for treating one wafer is lengthened by the amount of time it takes to move the wafer between the stage, the time required for alignment processing and focus measurement generally is longer than the time it takes to move the wafer. Further, with the twin stages, information relating to unevenness of a wafer surface measured beforehand by the measurement stage can be used at the time of exposure processing at the exposure stage and this makes it possible to obtain excellent focus follow-up. More specifically, a focus target value is created based upon information related to wafer-surface unevenness obtained by measurement at the measurement stage, and the position of the exposure stage along the optical axis is controlled based upon this focus target value, thereby implementing focus tracking that conforms to wafer unevenness.

An ordinary exposure apparatus having twin stages only uses the focus target value as one control target value in a stage apparatus having a feedback system. Consequently, if the wafer surface has a great amount of unevenness or the pattern used has a large step, the stage control system cannot follow up and there is the possibility that the desired focusing ability will not be achieved.

SUMMARY OF THE INVENTION

Accordingly, an object of the present invention is to implement stage control whereby even if the unevenness of a wafer surface or the step of a pattern is large, the stage is capable of following this up satisfactorily.

According to one aspect of the present invention, there is provided a stage control apparatus for controlling a first stage on which a substrate can be placed and moved, the apparatus comprising a target value generating unit configured to generate a target value relating to a vertical direction of the first stage based upon substrate surface position information that corresponds to unevenness of the surface of the substrate, and a signal generating unit configured to generate a drive command signal of the first stage based upon a deviation signal between the target value generated by the target value generating unit and a measured position of the first stage, wherein the signal generating unit obtains a target frequency possessed by the unevenness of the substrate surface, and generates the drive command signal using a signal obtained by amplifying a component of the target frequency of the deviation signal.

Also, according to another aspect of the present invention, there is provided a stage control method for controlling a first stage on which a substrate can be placed and moved, the method comprising a target value generating step of generating a target value relating to a vertical direction of the first stage based upon substrate surface position information that corresponds to unevenness of the surface of the substrate, and a signal generating step of generating a drive command signal of the first stage based upon a deviation signal between the target value generated at the target value generating step and a measured position of the first stage, wherein the signal generating step obtains a target frequency, which has been decided based upon a spatial frequency possessed by the unevenness of the substrate surface, and generates the drive command signal using a signal obtained by amplifying a component of the target frequency of the deviation signal.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

First Embodiment

Figure 1:
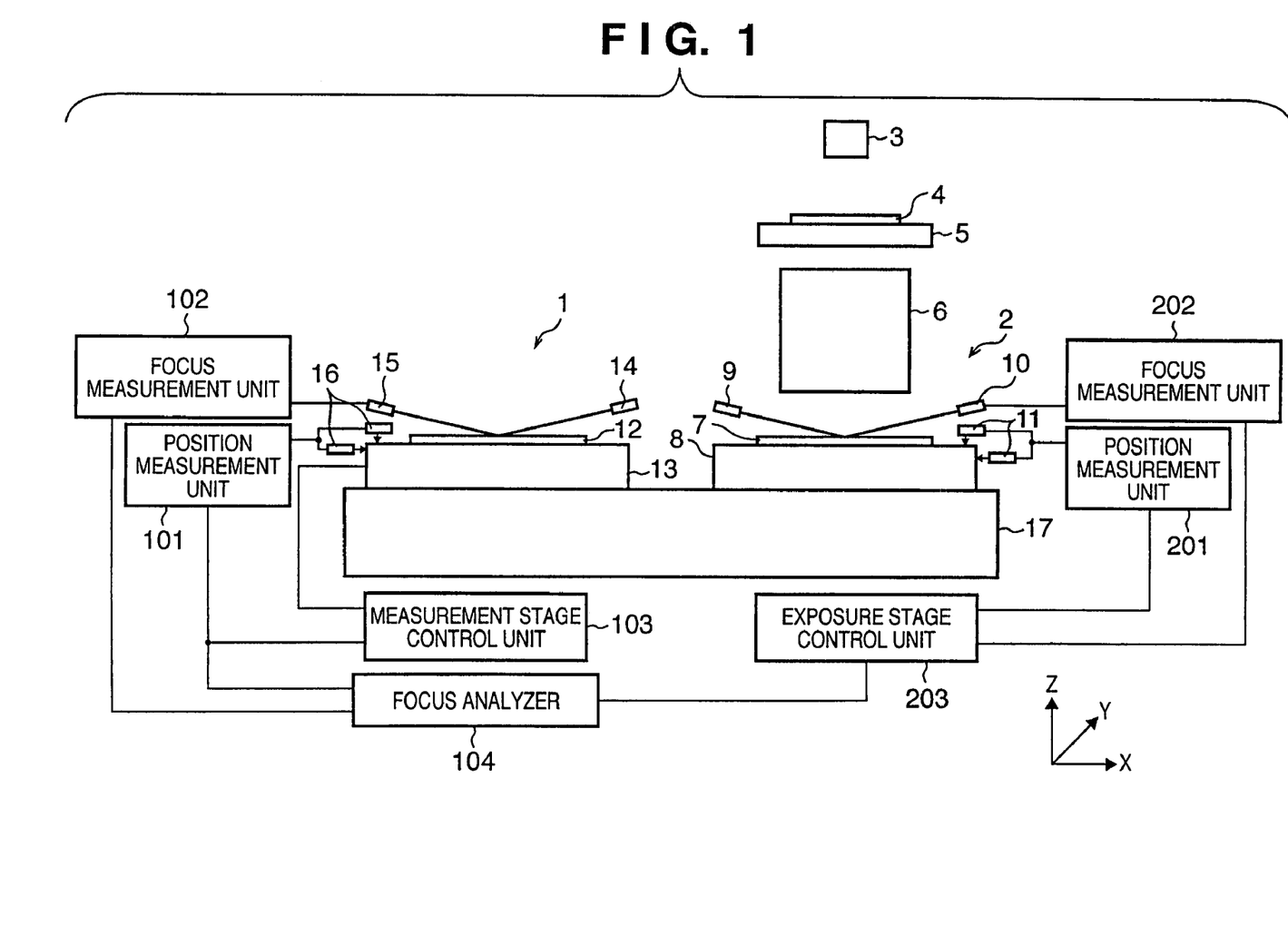
FIG. 1 is a diagram illustrating an overview of the structure of a semiconductor exposure apparatus according to a first embodiment of the present invention.

FIG. 1 is a diagram illustrating an overview of the structure of a semiconductor exposure apparatus according to a first embodiment of the present invention. As shown in FIG. 1, the exposure apparatus of this embodiment has twin stages, namely, a measurement stage system 1 and an exposure stage system 2. Components 101 to 104 that control the measurement stage system 1 and components 201 to 203 that control the exposure stage system 2 construct at least part of a stage controller.

The exposure stage system 2 has a wafer stage (referred to as an "exposure stage" below) 8 on which a wafer is placed and moved and with a structure for exposing the wafer. This structure is such that exposure light emitted from a light source 3 irradiates a reticle 4 that has been placed on a reticle stage 5. A projection optical system 6 narrows down the exposure light (reticle pattern light), which has passed through the reticle 4, at a prescribed magnification and projects the light upon the wafer 7 that has been placed on the exposure stage 8. The image of the reticle pattern is thus projected upon the photosensitive surface of the wafer 7. A projector 9 and a photoreceptor 10 form a focus sensor and detect the position of the photosensitive surface of the wafer 7. A focus measurement unit 202 generates a focus measurement signal (the vertical coordinate value of the wafer surface) from detection signals output by the focus sensor 9, 10, and outputs the focus measurement signal. A position sensor 11 measures the position (e.g., position along each of the X, Y and Z directions) of the exposure stage 8. A position measurement unit 201 generates a measured position from the detection signal produced by the position sensor 11 and outputs this measured position signal. The exposure stage system 2 also has an alignment mechanism for aligning the reticle and wafer. However, this mechanism need not be illustrated or described, as the components are well known in the art.

The measurement stage system 1 has a wafer stage (referred to as a "measurement stage" below) 13, a focus sensor (focus sensors 14, 15) constructed by a projector 14 and photoreceptor 15, and a position sensor 16. The photosensor detects the position of the photosensitive surface of a wafer 12. The position sensor 16 measures the position (e.g., position along each of the X, Y and Z directions) of the measurement stage 13. A focus measurement unit 102 generates a focus measurement signal (the vertical coordinate value of the wafer surface) from detection signals output by the focus sensors 14, 15, and outputs the focus measurement signal. A position measurement unit 101 generates a measured position from the detection signal produced by the position sensor 16 and outputs this measured position signal. The measurement stage system 1 also has an alignment mechanism for performing alignment and for measuring the coordinate positions of shots. However, this mechanism need not be illustrated or described, as the components are well known in the art. It should be noted that the exposure stage 8 and measurement stage 13 are placed on a stage surface plate 17. The exposed wafer on the stage 8 is unloaded from the exposure apparatus and the wafer that is to be exposed next is shifted from the measurement stage 13 to the exposure stage 8 by a shifting device (not shown).

An overview of control implementation in the exposure apparatus of this embodiment will be described next. The measurement stage system 1 is such that a measurement stage control unit 103 performs alignment of the wafer 12 and measures the coordinate position of each shot. The position measurement unit 101 outputs the vertical position of the measurement stage 13. The focus measurement unit 102 outputs the position of the photosensitive surface of wafer 12. A focus analyzer 104 generates a focus target value based on those outputs from the unit 101 and 102. The details of the focus analyzer 104 will become clear from the description that follows. The focus target value generated by the focus analyzer 104 is supplied to an exposure stage control unit 203 when a wafer that has been subjected to the above-described measurement has been shifted to the exposure stage 8 and is exposed.

The exposure stage control unit 203 subjects the wafer that has been placed on the exposure stage 8 to exposure treatment while executing control of focus direction utilizing the focus target value generated by the focus analyzer 104.

Figure 2:
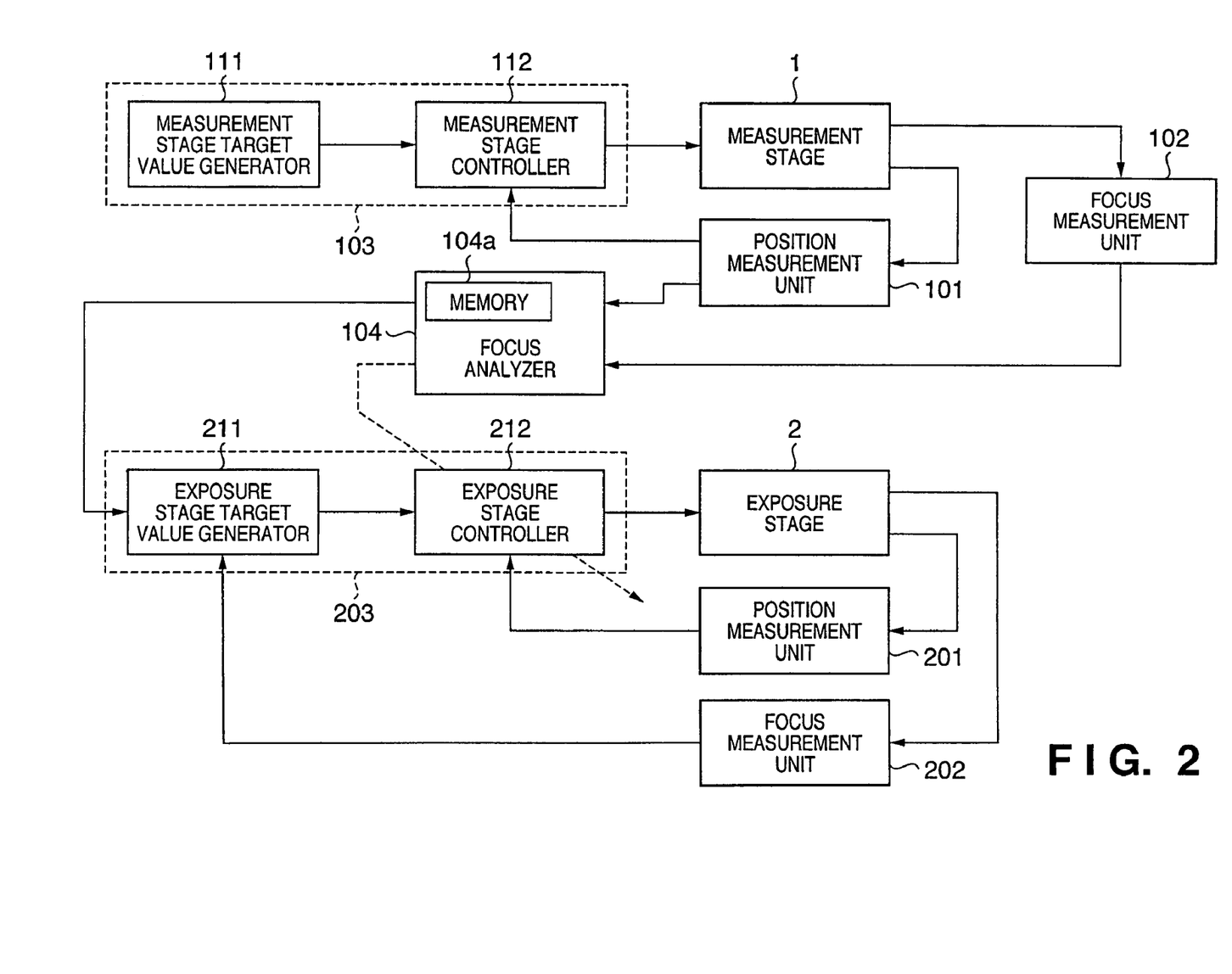
FIG. 2 is a diagram illustrating the configuration of a focus control system of a stage control apparatus according to first and second embodiments.

The operation of the focus control system according to the exposure apparatus shown in FIG. 1 will be described next. FIG. 2 illustrates components related to the focus control system extracted from the stage control apparatus in the exposure apparatus shown in FIG. 1. As illustrated in FIG. 2, the measurement stage control unit 103 has a measurement stage controller 112 for generating a measurement stage driving signal, and a measurement stage target value generator 111 for deciding the target position of the measurement stage 1 along the vertical direction. The exposure stage control unit 203 has an exposure stage controller 212 for generating an exposure stage drive signal, and an exposure stage target value generator 211 for generating the target position of the exposure stage along the vertical direction.

It should be noted that, in this embodiment, the vertical direction refers to the three degrees of freedom along the Z axis, $\theta x$ axis and $\theta y$ axis among the six degrees of freedom of motion. In this embodiment, stage control according to the present invention is applied to all of these three degrees of freedom. However, if not that much accuracy along the $\theta x$ axis and $\theta y$ axis is required, an arrangement in which control is applied only to the Z axis can be adopted in order to simplify the system. Further, a control system of the remaining three horizontally directed axes, namely, the X axis, Y axis and $\theta z$ axis, among the six degrees of freedom, is implemented by a well-known PID controller. However, this is not illustrated, for the sake of simplicity. Operation of the focus control system illustrated in FIG. 2 will be described below.

The position of the measurement stage 13 along the vertical direction is measured by the position sensor 16, and the measurement stage controller 112 generates a drive command signal that follows up the target position generated by the measurement stage target value generator 111. The vertical coordinate value of the surface of the wafer 13 is outputted as the focus measurement value from the focus measurement unit 102. The difference between the vertical position of the measurement stage 13 from the position measurement unit 101 and the focus measurement value from the focus measurement unit 102 is information that represents wafer unevenness. This information is referred to as flatness of the wafer in this embodiment.

The focus analyzer 104 calculates the flatness of the wafer based upon the measurement values from the focus measurement unit 102 and position measurement unit 101. The focus analyzer 104 calculates a typical frequency of the target position based upon the flatness. The typical frequency of the target position represents the frequency of the target position that the exposure stage 8 is to follow up. The focus analyzer 104 obtains the peak of the spatial frequency of wafer unevenness from the flatness of the wafer, and multiplies the spatial frequency value of this peak position by the speed of the exposure stage 8 at the time of exposure. The coefficients of the exposure stage controller 212 are set based upon the typical frequency of the target position thus obtained.

The exposure stage target value generator 211 generates the target position (position along the vertical direction) of the exposure stage form the wafer flatness found by the focus analyzer 104 and the focus measurement value of the exposure stage 8 (the output value from the focus measurement unit 202). The position of the exposure stage 8 along the vertical axis is measured by the position sensor 11 and is output from the position measurement unit 201. On the basis of the vertical position of the exposure stage 8 obtained from the position measurement unit 201, the exposure stage controller 212 generates a drive command signal that follows up the target position generated by the exposure stage target value generator 211.

Figure 3:
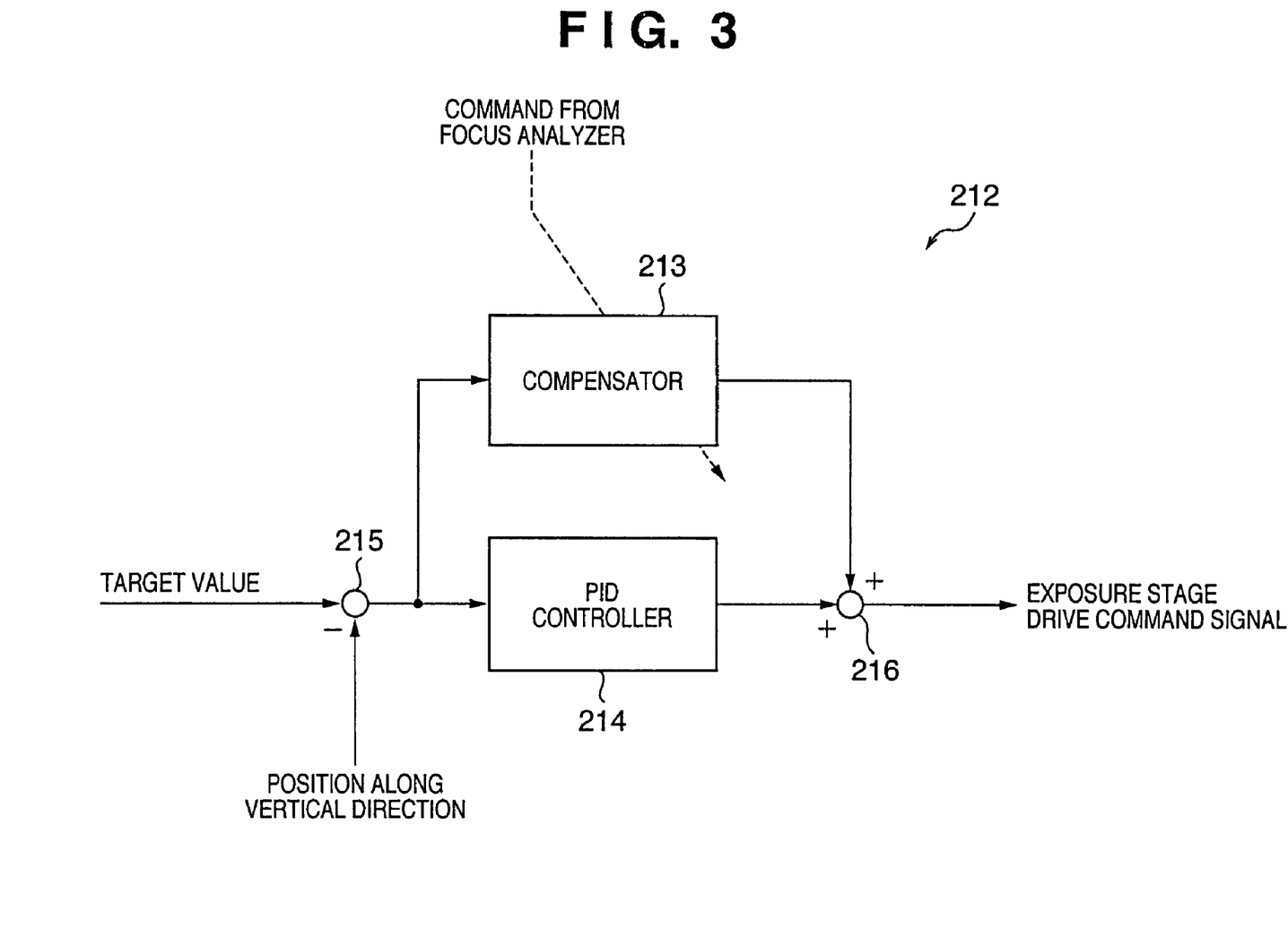
FIG. 3 is a block diagram illustrating the structure of an exposure stage controller according to the first embodiment.

The internal structure of the exposure stage controller 212 is illustrated in FIG. 3. The structure shown in FIG. 3 includes a PID controller 214, a compensator 213 and arithmetic units 215, 216. The arithmetic unit 215 generates a deviation signal between the target value (target value of the position of the exposure stage along the vertical direction) generated by the exposure stage target value generator 211 and the measured position of the exposure stage 8 along the vertical direction measured by the position measurement unit 201. The deviation signal is supplied to the PID controller 214 and compensator 213. The signals from the PID controller 214 and compensator 213 are added by the arithmetic unit 216 to obtain the drive command signal of the exposure stage. The deviation signal is processed by well-known PID control in the PID controller 214. Further, the characteristic of the compensator 213 is represented by the transfer function of Equation (1) below $$K_c \frac{\omega^2}{s^2 + \omega^2} \quad (1)$$

where $K_c$ represents a predetermined gain and $\omega$ an angular frequency value that is the result of multiplying the typical frequency of the target position, which has been found by the focus analyzer 104, by $2\pi$.

The compensator 213 has a sinusoidal internal model (Equation 1) having a frequency that is equal to the typical frequency of the target position. The target-position frequency value component of the deviation signal is amplified and added to the PID-processed deviation signal by the compensator 213.

Figure 4:
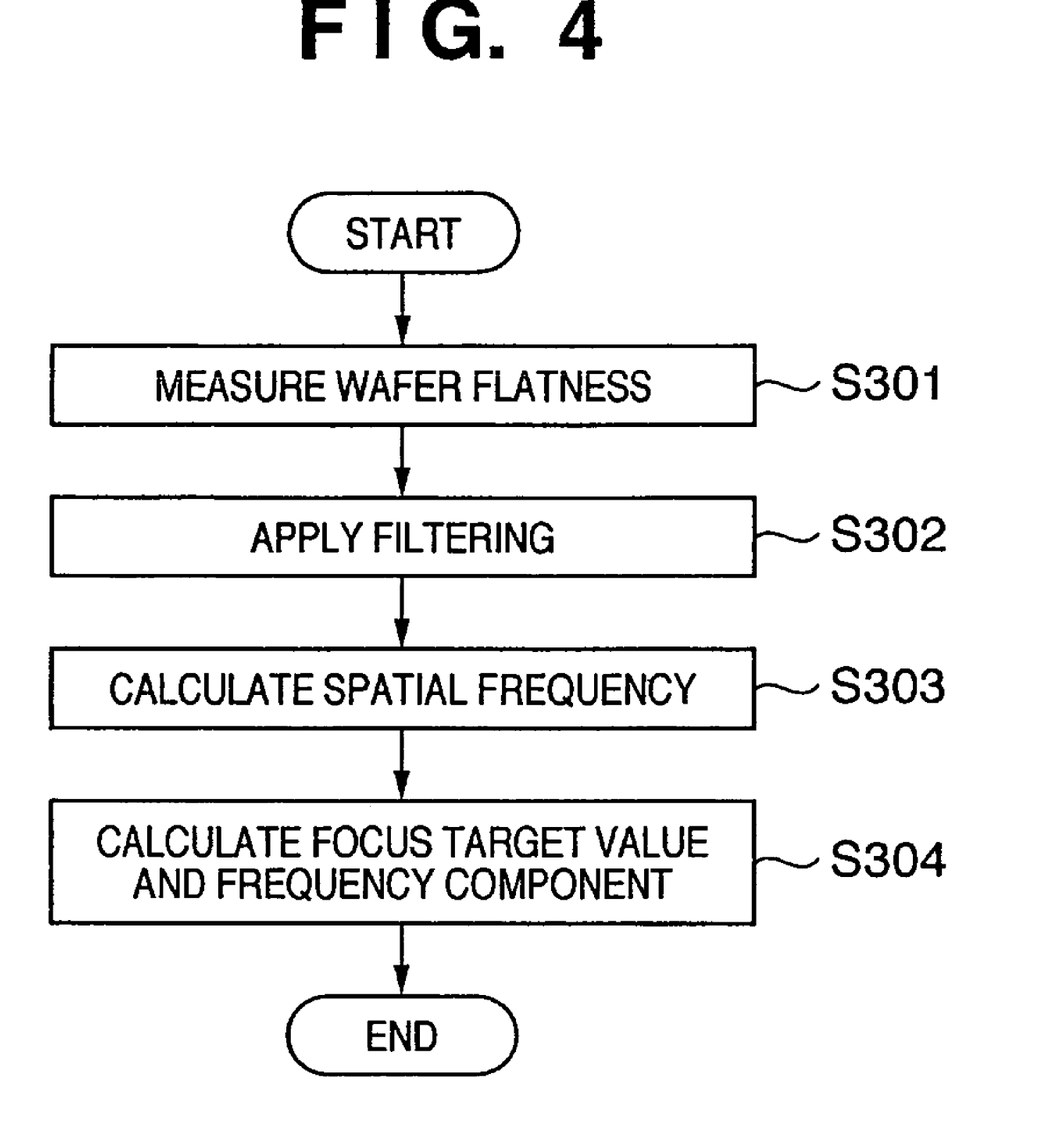
FIG. 4 is a flowchart illustrating the operation of a focus analyzer according to the first embodiment.

A procedure for calculating the typical frequency of the target position in the focus analyzer 104 will be described with reference to the flowchart of FIG. 4. It will be assumed that this procedure is implemented as software of a CPU (not shown) in the exposure apparatus (stage controller). However, some or all of this processing may just as well be implemented by special-purpose hardware.

At step S301, wafer flatness is calculated from the difference between the position of the measurement stage long the vertical direction (obtained from the position measurement unit 101) and the focus measurement position (obtained from the focus measurement unit 102), and is stored in a memory 104*a*. A low-pass filter eliminates the high-frequency noise components from the flatness in step S302. Also, a notch filter (band eliminate filter) may be used to remove frequency components that include mechanical resonance frequency from the flatness. As a result, mechanical resonance frequency is removed from the spatial frequency of unevenness represented by the flatness. An FFT operation is performed at step S303 to obtain the value of spatial frequency at which the FFT value is maximum. The value of frequency to be followed up by the exposure stage 8, namely, the typical frequency of the target position, is obtained at step S304 from the speed of the exposure stage 8 and the spatial frequency value found at step S303, and this value is stored in the memory 104*a*. When the measured wafer is shifted to the exposure stage 8 and exposure treatment has been applied, the flatness and the typical frequency of the target position that have been stored in the memory 104*a* are read out by the exposure stage control unit 203 (exposure stage target value generator 211), and the above-described control is carried out.

By constructing the control system as set forth above, a focus control system that is capable of following up the unevenness of the most dominant spatial frequency in the unevenness of the wafer can be implemented by utilizing a sinusoidal internal model.

Although the measurement stage 13 and exposure stage 8 of this embodiment are constructed on the single base plate 17, separate steps, constructed on different base plates, may be adopted. Further, the stage controllers 112, 212 and target value generators 111, 211 may be implemented by using CPU software.

Thus, in accordance with the first embodiment, as described above, the exposure stage controller 212 is implemented by adding the compensator 213 to the PID controller 214. As a result, an existing apparatus already having a PID control system can have its focus controllability improved in a simple manner.

Second Embodiment

Figure 5:
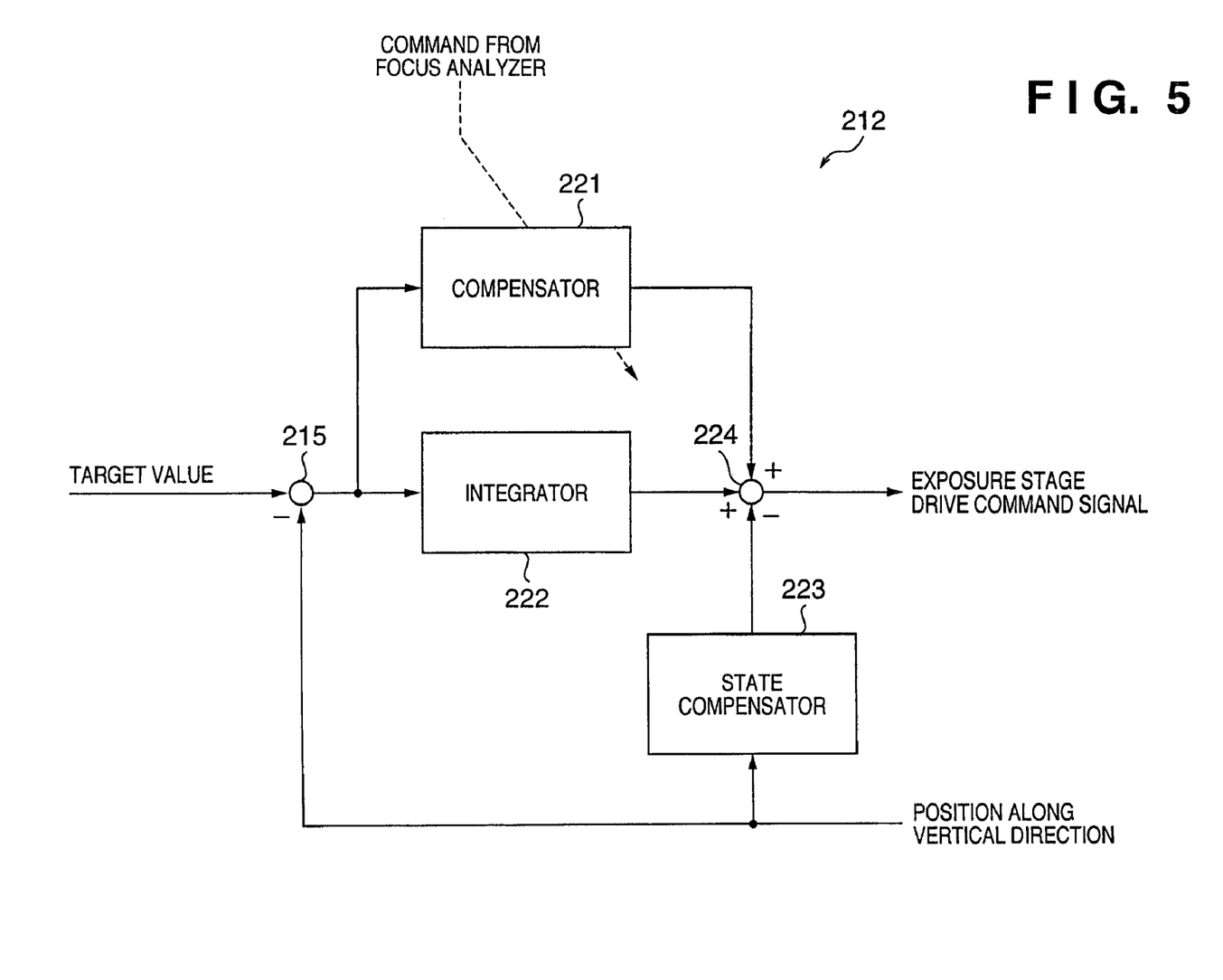
FIG. 5 is a block diagram illustrating the structure of an exposure stage controller according to the second embodiment.

FIG. 5 is a block diagram illustrating the structure of the exposure stage controller 212 according to a second embodiment of the invention. In the second embodiment, the internal structure of the exposure stage controller 212 is changed from the arrangement shown in FIG. 3 to the arrangement shown in FIG. 5. Other aspects are the same as those of the first embodiment and need not be described again.

The arrangement of FIG. 5 includes a compensator 221, an integrator 222 and a state compensator 223. In the second embodiment, the arrangement is such that the compensator 221 has been added to a control system well known as a status feedback servo system. That is, the deviation signal between the target value from the exposure stage target value generator 211 and the vertical position of the stage output from the position measurement unit 201 is supplied from the arithmetic unit 215 to the integrator 222 and compensator 221 of a status feedback servo system. The integrator 222 and state compensator 223 construct a feedback servo system, and the outputs of the integrator 222 and state compensator 223 are combined by an arithmetic unit 224. Meanwhile, the output from the compensator 221 is also combined by the arithmetic unit 224 to generate the drive command signal for the exposure stage. Here, the characteristic of the compensator 221 is represented by the transfer function of Equation (2) below $$K_{c1}\frac{\omega_1^2}{s^2+\omega_1^2}+K_{c2}\frac{\omega_2^2}{s^2+\omega_2^2} \qquad (2)$$

where $K_{c1}$ and $K_{c2}$ represent predetermined gains, and $\omega_1$, $\omega_2$ represent values that are the result of multiplying the respective frequencies $f_1$, $f_2$, which have been found by the focus analyzer 104, by $2\pi$. The focus analyzer 104 of the second embodiment is capable of supporting spatial frequencies of two peaks in the result of computation of the FFT operation. According to this embodiment, the frequency of the larger peak value (the more dominant frequency) is assumed to be $f_1$.

It should be noted that although the compensator 221 is implemented by the sum of two terms, as indicated above (Equation 2), it may just as well be implemented by the sum of N terms, as indicated by Equation (3) below.

$$\sum_{i=1}^{N} K_{ci}\frac{\omega_i^2}{s^2+\omega_i^2} \qquad (3)$$

In accordance with the foregoing, the focus control system can follow up unevenness even in a case wherein many dominant spatial frequencies exist in the unevenness of a wafer. N-number of frequencies may be extracted in order of decreasing peak value of FFT result. Alternatively, x-number ($x \leq N$) of frequencies, which correspond to peak values larger than a prescribed level, may be extracted in order of decreasing frequency. Further, it goes without saying that the compensator 221, which utilizes two or more frequency values of the target position, can be used as the compensator 213 of the first embodiment. Similarly, the compensator 213 of the first embodiment, corresponding to a single frequency of a target value, may be used as the compensator 221 of the second embodiment.

Third Embodiment

Figure 6:
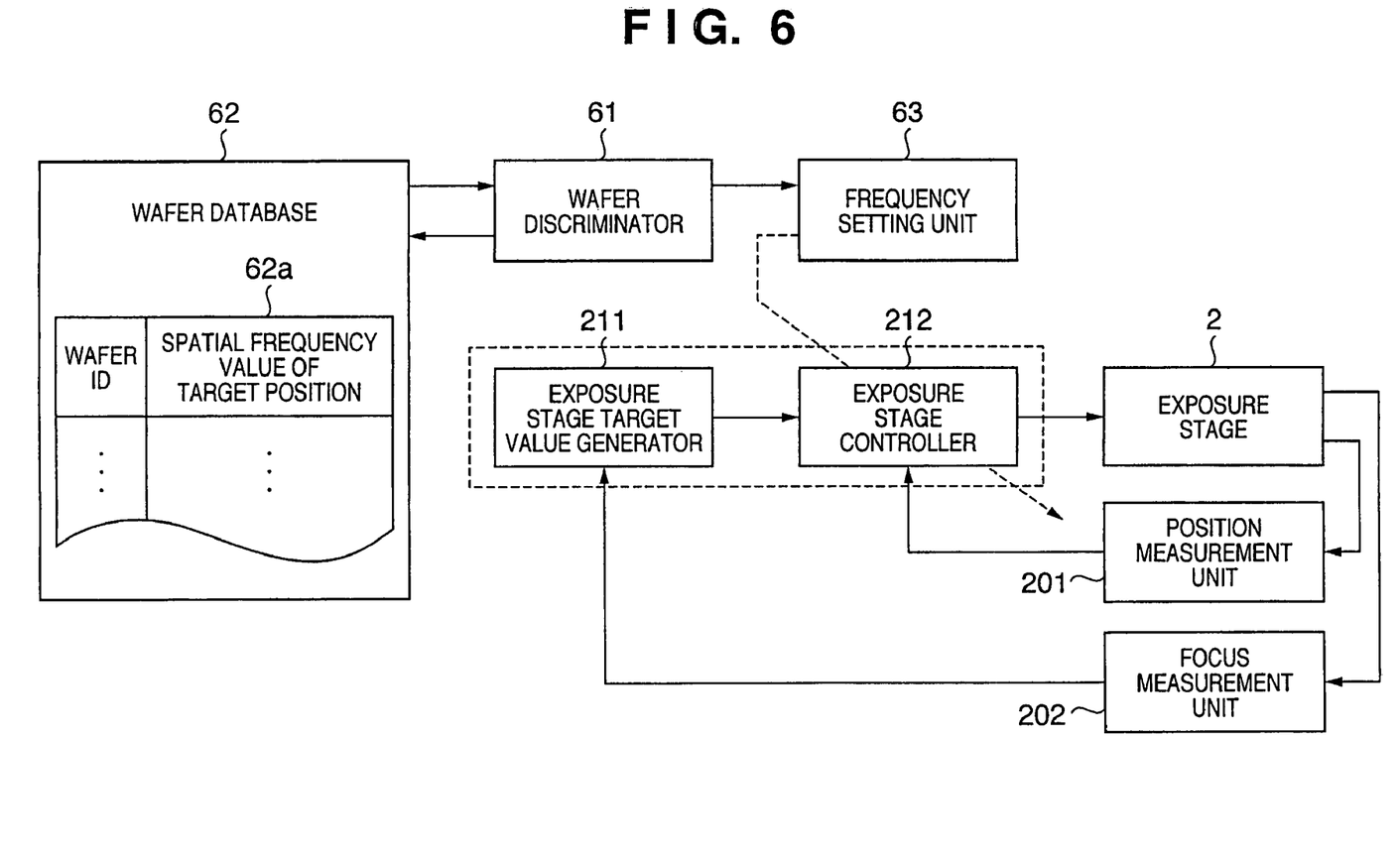
FIG. 6 is a diagram illustrating the configuration of a focus control system of a stage control apparatus according to a third embodiment of the present invention.

FIG. 6 is a diagram illustrating the configuration of a focus control system of a stage control apparatus in a semiconductor exposure apparatus according to a third embodiment of the present invention. In the first and second embodiments, the measurement stage system 1 is provided to measure flatness, wafer by wafer, and to obtain a spatial frequency value of the target position. In the third embodiment, the spatial frequency value of the target position of every wafer is held in a wafer database to make utilization possible by the exposure stage system 2 and to enable the deletion of the measurement stage system 1 shown in FIG. 1.

Components in FIG. 6 similar to those in FIGS. 1 and 2 are designated by like reference characters and need not be described again. The arrangement of FIG. 6 includes the focus measurement unit 202 for measuring the vertical coordinate value of the surface of a wafer placed on a stage, a wafer discriminator 61 for discriminating a wafer placed on the exposure stage 8, a wafer database 62 for storing wafer information, and a frequency setting unit 63 for setting the coefficient (spatial frequency value of the target position) of the exposure stage controller 212. The internal structure of the exposure stage controller 212 is as illustrated in the first embodiment (FIG. 3). Further, a table 62a of correspondence between individual information (IDs) relating to wafers and spatial frequencies of target positions has been registered in the wafer database 62.

Based upon a focus measurement value obtained from the focus measurement unit 202, the exposure stage target value generator 211 decides the target value of the exposure stage 8 along the vertical direction and supplies this value to the exposure stage controller 212. The exposure stage controller 112 follows up the target value from the exposure stage target value generator 211 and generates the target value of the exposure stage 8 in such a manner that the exposure beam will come into focus on the wafer surface.

The wafer discriminator 61 reads the individual information that has been recorded on the wafer placed on the exposure stage 8 and consults the wafer database 62. The wafer database 62 refers to the table 62a and, if the wafer information (spatial frequency value of the target position) exists, sends the frequency value of unevenness conforming to this exposure process back to the wafer discriminator 61. The wafer discriminator 61 sends this frequency value to the frequency setting unit 63. The frequency setting unit 63 changes the coefficient [$\omega$ in Equation (1) in this embodiment] of the exposure stage controller 212, based upon this frequency value.

By thus constructing the control system, it is possible to follow up well the unevenness of wafers corresponding to the exposure processes of individual wafers without providing the measurement stage system 1.

Thus, in accordance with each of the foregoing embodiments, a focus control system that is capable of following up wafer unevenness can be realized. In particular, since unevenness often is distributed periodically owing to pattern steps, excellent focus follow-up can be achieved at the time of multiple exposure. That is, focus follow-up error can be suppressed by constructing a control system in which a stage is capable of following up a target frequency that is to be followed up.

Thus, in accordance with the present invention, as described above, even if the unevenness of a wafer surface or the step of a pattern is large, a stage is capable of follow-up in a satisfactory fashion.

As many apparently widely different embodiments of the present invention can be made without departing from the spirit and scope thereof, it is to be understood that the invention is not limited to the specific embodiments thereof except as defined in the appended claims.

This application claims the benefit of Japanese Application No. 2005-035210, filed Feb. 10, 2005, which is hereby incorporated by reference herein in its entirety.

What is claimed is:

1. A stage control apparatus for controlling a first stage on which a substrate can be placed and moved, the apparatus comprising:

a target value generating unit configured to generate a target value relating to a vertical direction of the first stage based upon substrate surface position information that corresponds to unevenness of the surface of the substrate;

a signal generating unit configured to generate a drive command signal of the first stage based upon a deviation signal between the target value generated by said target value generating unit and a measured position of the first stage;

a first acquisition unit configured to acquire and to hold in memory the substrate surface position information by measuring the surface position of the substrate on a second stage separate from the first stage, wherein the substrate can be placed on and moved by the second stage; and a second acquisition unit configured to eliminate frequency components, which include a mechanical resonance frequency of the second stage, from spatial frequency of the unevenness represented by the substrate surface position information, to decide a target frequency based upon the spatial frequency after elimination of the frequency components and to hold in the memory the target frequency, wherein said target value generating unit acquires the substrate surface position information from the memory, and wherein said signal generating unit acquires from the memory the target frequency which has been decided by said second acquisition unit, and generates the drive command signal using a signal obtained by amplifying a component of the target frequency of the deviation signal.

2. The apparatus according to claim 1, wherein said signal generating unit generates the drive command signal by adding a signal obtained by processing the deviation signal using a PID controller and the signal obtained by amplifying the component of the target frequency.

3. The apparatus according to claim 1, wherein said signal generating unit generates the drive command signal by adding the signal obtained by amplifying the component of the target frequency to a signal obtained in a feedback system of a status feedback servo system to which the deviation signal is supplied.

4. The apparatus according to claim 1, wherein two or more target frequencies exist and said signal generating unit generates the drive command signal using a signal obtained by amplifying the components of the two or more target frequencies in the deviation signal.

5. A stage apparatus comprising:
the stage control apparatus set forth in claim 1; and
the first stage controlled by said stage control apparatus.

6. A stage apparatus comprising:
the stage control apparatus set forth in claim 1; and
the first and second stages controlled by said stage control apparatus.

7. The stage apparatus according to claim 6, wherein the first and second stages are arranged on the same stage surface plate.

8. A stage control apparatus for controlling a first stage on which a substrate can be placed and moved, the apparatus comprising:

a target value generating unit configured to generate a target value relating to a vertical direction of the first stage based upon substrate surface position information that corresponds to unevenness of the surface of the substrate; and a signal generating unit configured to generate a drive command signal of the first stage based upon a deviation signal between the target value generated by said target value generating unit and a measured position of the first stage, wherein said signal generating unit obtains a target frequency, which has been decided based upon a spatial frequency possessed by the unevenness of the substrate surface, and generates the drive command signal using a signal obtained by amplifying the component of the target frequency of the deviation signal using a sinusoidal internal model that is equal to the target frequency.

9. The apparatus according to claim 8, further comprising:
a first acquisition unit configured to acquire and to hold in memory the substrate surface position information by measuring the surface position of the substrate on a second stage separate from the first stage, wherein the substrate can be placed on and moved by the second stage; and a second acquisition unit configured to acquire and to hold in the memory the target frequency based upon the substrate surface position information acquired by said first acquisition unit, wherein said target value generating unit acquires the substrate surface position information from the memory and said signal generating unit acquires the target frequency from the memory.

10. The apparatus according to claim 8, further comprising:
a storage unit configured to store a target frequency of each substrate in correspondence with identification information of each substrate; and a measuring unit configured to measure a vertical position of the surface of the substrate placed on the first stage, wherein said target value generating unit uses the position, which has been measured by said measuring unit, as the substrate surface position information, and said signal generating unit reads the identification information of the substrate from the substrate and acquires a target frequency that corresponds to the identification information read from said storage unit.

11. The apparatus according to claim 8, wherein said signal generating unit generates the drive command signal by adding a signal obtained by processing the deviation signal using a PID controller and the signal obtained by amplifying the component of the target frequency.

12. The apparatus according to claim 8, wherein said signal generating unit generates the drive command signal by adding the signal obtained by amplifying the component of the target frequency to a signal obtained by a feedback system of a status feedback servo system to which the deviation signal is applied.

13. The apparatus according to claim 8, wherein two or more target frequencies exist and said signal generating unit generates the drive command signal using a signal obtained by amplifying the components of the two or more target frequencies in the deviation signal.

14. A stage apparatus comprising;
the stage control apparatus set forth in claim 8; and
the first stage controlled by said stage control apparatus.

15. A stage control method for controlling a first stage on which a substrate can be placed and moved, the method comprising:

a target value generating step of generating a target value relating to a vertical direction of the first stage based upon substrate surface position information that corresponds to unevenness of the surface of the substrate;

a signal generating step of generating a drive command signal of the first stage based upon a deviation signal between the target value generated at said target value generating step and a measured position of the first stage;

a first acquisition step of acquiring and holding in memory the substrate surface position information by measuring the surface position of the substrate on a second stage separate from the first stage, wherein the substrate can be placed on and moved by the second stage; and a second acquisition step of eliminating frequency components, which include a mechanical resonance frequency of the second stage, from spatial frequency of the unevenness represented by the substrate surface position information, deciding a target frequency based upon the spatial frequency after elimination of the frequency components and holding in the memory the target frequency, wherein said target value generating step acquires the substrate surface position information from the memory, and wherein said signal generating step acquires from the memory the target frequency which has been decided in said second acquisition step, and generates the drive command signal using a signal obtained by amplifying a component of the target frequency of the deviation signal.

16. An exposure apparatus having a first stage on which a photosensitive substrate can be placed and moved, and a stage control apparatus for controlling the first stage, wherein the stage control apparatus comprises:

(i) a target value generating unit configured to generate a target value relating to a vertical direction of the first stage based upon substrate surface position information that corresponds to unevenness of the surface of the photosensitive substrate in driving of the substrate stage in order to subject the photosensitive substrate to exposure treatment;

(ii) a signal generating unit configured to generate a drive command signal of the first stage based upon a deviation signal between the target value generated by said target value generating unit and a measured position of the first stage;

(iii) a first acquisition unit configured to acquire and to hold in memory the substrate surface position information by measuring the surface position of the substrate on a second stage separate from the first stage, wherein the substrate can be placed on and moved by said second stage; and (iv) a second acquisition unit configured to eliminate frequency components, which include a mechanical resonance frequency of the second stage, from spatial frequency of the unevenness represented by the substrate surface position information, to decide a target frequency based upon the spatial frequency after elimination of said frequency components and to hold in the memory the target frequency, wherein said target value unit acquires the substrate surface position information from the memory, and wherein said signal generating unit acquires from the memory a target frequency which has been decided by said second acquisition unit, and generates a drive command signal using a signal obtained by amplifying a component of the target frequency of the deviation signal.

17. A stage control method for controlling a first stage on which a substrate can be placed and moved, the method comprising:

a target value generating step of generating a target value relating to a vertical direction of the first stage based upon substrate surface position information that corresponds to unevenness of the surface of the substrate; and a signal generating step of generating a drive command signal of the first stage based upon a deviation signal between the target value generated in said target value generating step and a measured position of the first stage, wherein said signal generating step obtains a target frequency, which has been decided based upon a spatial frequency possessed by the unevenness of the substrate surface, and generates the drive command signal using a signal obtained by amplifying the component of the target frequency of the deviation signal using a sinusoidal internal model that is equal to the target frequency.

18. An exposure apparatus having a first stage on which a photosensitive substrate can be placed and moved, and a stage control apparatus for controlling the first stage, wherein the stage control apparatus comprises:

(i) a target value generating unit configured to generate a target value relating to a vertical direction of the first stage based upon substrate surface position information that corresponds to unevenness of the surface of the photosensitive substrate in driving of the substrate stage in order to subject the photosensitive substrate to exposure treatment; and (ii) a signal generating unit configured to generate a drive command signal of the first stage based upon a deviation signal between the target value generated by said target value generating unit and a measured position of the first stage, wherein said signal generating unit obtains a target frequency, which has been decided based upon a spatial frequency possessed by the unevenness of the substrate surface, and generates the drive command signal using a signal obtained by amplifying the component of the target frequency of the deviation signal using a sinusoidal internal model that is equal to the target frequency.

* * * * *